United States Patent
Klier

(10) Patent No.: US 12,183,517 B2
(45) Date of Patent: Dec. 31, 2024

(54) POWER ELECTRONIC ASSEMBLY WITH A HOUSING AND WITH A CAPACITOR DEVICE ARRANGED THEREIN

(71) Applicant: SEMIKRON ELEKTRONIK GMBH & CO. KG, Nuremberg (DE)

(72) Inventor: Johannes Klier, Amberg (DE)

(73) Assignee: SEMIKRON ELEKTRONIK GMBH CO., KG, Nuremberg (DE)

( * ) Notice: Subject to any disclaimer, the term of this patent is extended or adjusted under 35 U.S.C. 154(b) by 0 days.

(21) Appl. No.: 18/239,365

(22) Filed: Aug. 29, 2023

(65) Prior Publication Data
US 2024/0194412 A1 Jun. 13, 2024

(30) Foreign Application Priority Data
Sep. 13, 2022 (DE) .................. 10 2022 123 261.1

(51) Int. Cl.
  *H01G 4/38* (2006.01)
  *H01G 2/10* (2006.01)
  (Continued)

(52) U.S. Cl.
  CPC ............ *H01G 4/38* (2013.01); *H01G 2/106* (2013.01); *H01G 4/228* (2013.01); *H05K 7/14329* (2022.08); *H05K 7/2089* (2013.01)

(58) Field of Classification Search
  CPC ......... H01G 2/106; H01G 4/38; H01G 4/228; H05K 7/2089; H05K 7/14329
  See application file for complete search history.

(56) References Cited

U.S. PATENT DOCUMENTS

| 7,280,343 B1 * | 10/2007 | Zednicek ................. H01G 9/26 29/25.03 |
| 8,018,712 B2 | 9/2011 | Yang et al. |
| 2023/0021288 A1 * | 1/2023 | Nishimachi .......... H02M 1/327 |

FOREIGN PATENT DOCUMENTS

| CN | 112366086 A * | 2/2021 | ............ H01G 4/228 |
| DE | 102015113873 B3 | 7/2016 | |

(Continued)

OTHER PUBLICATIONS

DE 10 2022 123 261.1, Search report dated Dec. 22, 2023, 6 pages—German, 6 pages—English.

(Continued)

*Primary Examiner* — David M Sinclair
(74) *Attorney, Agent, or Firm* — Andrew F. Young; NOLTE LACKENBACH SIEGEL

(57) ABSTRACT

A power electronic assembly with a housing and a capacitor device therein. The capacitor device has capacitor elements, each with a first and a second capacitor contact device, and a capacitor busbar having a first metal shaped body with a first contact point and a second metal shaped body with a second contact point. The first metal shaped body of first polarity has a plurality of first terminal contact devices each connected to a first capacitor contact device and the second metal shaped body of second polarity has a plurality of second terminal contact devices each connected to a second capacitor contact device. The individual current paths each formed from a first partial current path between the first contact point and a first terminal contact device and a second partial current path between the second terminal contact device associated with the first and the second contact point each have the same current path length.

11 Claims, 3 Drawing Sheets

(51) Int. Cl.
*H01G 4/228* (2006.01)
*H05K 7/14* (2006.01)
*H05K 7/20* (2006.01)

(56) References Cited

FOREIGN PATENT DOCUMENTS

JP  2015-103777 A  6/2015
WO  WO 91/01041  1/1991

OTHER PUBLICATIONS

German Appln. No. 10 2022 123 261.1, Examination Report dated Jun. 28, 2024, 5 pages—German 4 pages,—English 4.
German Appln. No. 10 2022 123 261.1, Decision to Grant dated Aug. 13, 2024, 4 pages—German 4 pages—English—4.
German Appln. No. 10 2022 123 261.1, Response to Office Action and amendment filed dated Apr. 12, 2024, 29 pages—German, 9-pages English.

\* cited by examiner

POWER ELECTRONIC ASSEMBLY WITH A HOUSING AND WITH A CAPACITOR DEVICE ARRANGED THEREIN

CROSS REFERENCE TO RELATED APPLICATIONS

This application relates to and claims priority to DE 10 2022 123 261.1 filed Sep. 13, 2022, the entire contents of which are incorporated herein fully by reference.

FIGURE SELECTED FOR PUBLICATION

FIG. 6.

BACKGROUND OF THE INVENTION

Field of the Invention

The invention describes a power electronic assembly with a housing and with a capacitor device arranged therein, wherein the capacitor device has a plurality of capacitor elements each with a first and a second capacitor contact device and a capacitor busbar. The latter has a first planar metal shaped body with a first contact point and a second planar metal shaped body with a second contact point. The contact points are preferably used for electrically conductive connection to a power semiconductor module. The first planar metal shaped body of first polarity has a plurality of first terminal contact devices each electrically conductively connected to a first capacitor contact device, while the second planar metal shaped body of second polarity has a plurality of second terminal contact devices each electrically conductively connected to a second capacitor contact device.

Description of the Related Art

From the prior art, disclosed by way of example in DE 10 2015 113 873 B3, a power electronic assembly is known which is formed with a housing and with a capacitor device arranged therein, wherein the housing has a cooling surface which is arranged in the interior and is designed to be cooled by means of a cooling device integrated in the housing or external to the housing, and wherein the capacitor device has a capacitor with in each case one contact device of first and second polarity and a capacitor busbar. This capacitor busbar has a first planar metal shaped body and a second planar metal shaped body, wherein the first planar metal shaped body is electrically conductively connected to the first contact device of first polarity and the second planar metal shaped body is electrically conductively connected to the second contact device of second polarity. Furthermore, a first portion of the first metal shaped body comprises a first sub-portion arranged parallel to and spaced from the cooling surface and a second sub-portion in thermal contact with the cooling surface, wherein both sub-portions are interconnected by an intermediate portion. The first and second metal shaped bodies are arranged closely adjacent to each other for at least 80% of their planar extent.

A constant deficiency in such systems is an uneven load on the individual capacitor elements, also caused by the different charging or discharging currents of the respective capacitor elements.

Aspects and Objects of the Invention

At least one of the objects of the present invention is to provide an improvement over the related art.

At least one other alternative and adaptive object of the invention is to make the load on the individual capacitor elements homogeneous during operation.

This object is achieved according to the invention by a power electronic assembly with a housing and with a capacitor device arranged therein, wherein the capacitor device has a plurality of capacitor elements each with a first and a second capacitor contact device and a capacitor busbar which has a first metal shaped body with a first contact point and a second metal shaped body with a second contact point, wherein the first metal shaped body of first polarity has a plurality of first terminal contact devices each electrically conductively connected to a first capacitor contact device and the second metal shaped body of second polarity has a plurality of second terminal contact devices each electrically conductively connected to a second capacitor contact device, wherein respective individual current paths each formed from a first partial current path between the first contact point and a first terminal contact device and a second partial current path between the second terminal contact device associated with the first and the second contact point each have the same current path length.

The respective metal shaped body is preferably planar here.

It may be advantageous if the respective first capacitor contact device of a capacitor element is arranged on a first outer surface and the associated second capacitor contact device is arranged on a second surface of the capacitor element opposite the first.

It may be preferred if the capacitor elements are arranged in an M×N matrix, with M>0 and N>2, in particular N>3.

It is particularly preferred in the case of an M×N matrix, with M=2, that both metal shaped bodies in the region of the capacitor device have a linear main portion with a plurality of laterally projecting sub-portions, wherein the associated terminal contact devices are arranged on the respective laterally projecting sub-portions.

It is also preferred, in the case of an M×N matrix, with M>2, that one of the two metal shaped bodies in the region of the capacitor device is formed with a linear main portion with a plurality of laterally projecting sub-portions, wherein the associated terminal contact devices are arranged in the course of the respective laterally projecting sub-portions, and the other metal shaped body is formed with a plurality of linear main portions with laterally projecting sub-portions, wherein the associated terminal contact devices are arranged both on the respective main portion and on the respective sub-portions.

It may be particularly preferred if a rear portion is arranged parallel to the main portion and may also be present with M=1.

In principle, it is preferred if a first current flow direction in the portion of the terminal contact devices, which in particular coincides with the first main portion, of the first metal shaped body is equal to a second current flow direction in the portion of the terminal contact devices, which in particular coincides with the second main portion, of the first metal shaped body.

It can be advantageous if a power semiconductor module is arranged in the housing and is electrically conductively connected to the contact points of the capacitor busbar polarity-appropriately.

In principle, it is advantageous if the housing has a cup-like recess in which the capacitor device is arranged. In this case, the recess around the capacitor device can be at least partially, preferably almost completely, filled with an electrically insulating potting compound.

It may also be preferable if one of the metal shaped bodies, in the portion of its terminal contact devices, is in indirect thermal contact with a cooling surface. In this case, an electrically insulating insulation device, in particular in the form of a plastics film or an insulating ceramic layer, can be arranged between the cooling surface, preferably in the portion of the connection devices. Furthermore, the cooling surface can be formed as a part of the housing, through which a cooling liquid preferably flows.

It is particularly preferred if a bottom of the recess, if available, is designed as a cooling surface.

Of course, unless excluded per se or explicitly, the features mentioned in the singular may also be present several times in the assembly according to the invention. It is understood that the various embodiments of the invention may be realized individually or in any combination to achieve improvements. In particular, the features mentioned and explained above and below can be used not only in the combinations indicated, but also in other combinations or alone, without departing from the scope of the present invention.

Further explanations of the invention, advantageous details and features can be found in the following description of the exemplary embodiments of the invention shown schematically in the figures or respective parts thereof.

The above and other aspects, features, objects, and advantages of the present invention will become apparent from the following description read in conjunction with the accompanying drawings for exemplary but nonlimiting embodiments, in which like reference numerals designate the same elements.

DETAILED DESCRIPTION OF THE PREFERRED EMBODIMENTS

Figure 1:
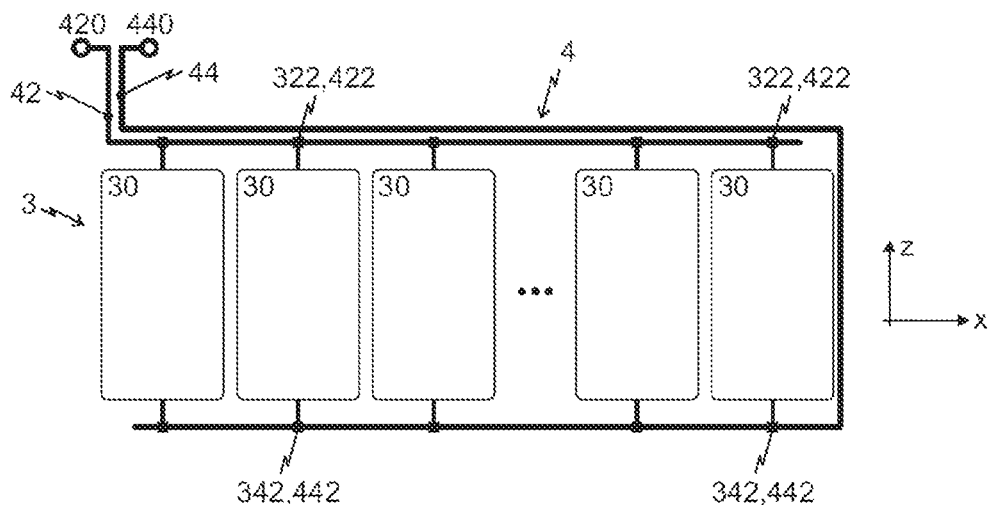
FIG. 1 shows a section through a first assembly according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' or 'bond' or and similar terms do not necessarily denote direct and immediate connections, but also include connections through intermediate elements or devices. For purposes of convenience and clarity only, directional (up/down etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

FIG. 1 shows a section through a first assembly according to the invention with a capacitor device 3, which has a plurality of capacitor elements 30. These are arranged here in series and thus in the form of a 1×N matrix. Without limiting generality, the capacitor elements 30 shown here are cylindrical in shape and each have two circular end faces, but any suitable shape or geometry may be used herein. These end faces form the respective surfaces on which the capacitor contact devices 322, 342 are arranged: in each case a first capacitor contact device 322 on the first end face and a second capacitor contact device 342 on the second end face arranged opposite the first. These capacitor contact devices are, moreover, designed in accordance with standard technical practice.

The assembly according to the invention further comprises a capacitor busbar 4 which is formed from a first and a second metal shaped body 42, 44. The respective metal bodies 42, 44 have a contact point 420, 440 for connection to further components, for example a power semiconductor module. In their course, the respective metal shaped bodies 42, 44, which in this case are of planar design, have bends and a plurality of terminal contact devices 422, 442 for electrically conductive connection to respective associated capacitor contact devices 322, 342.

The first metal shaped body 42 has a first polarity in operation, thus forming the positive DC voltage potential of the assembly, while the second metal shaped body 44 has a second polarity in operation, thus forming the negative DC voltage potential.

To charge the individual capacitor elements 30, current flows through a current path extending from the first contact point 420 through the respective capacitor element 30 to the second contact point 440. Here, a first partial current path 52 is formed between the first contact point 420 via the metal shaped body 42 to the first terminal contact device 422 of the metal shaped body 42 associated with the respective capacitor element 30, to the associated first capacitor contact device 322. Similarly, a second partial current path 54 is formed, which extends from the second capacitor contact device 342 of the capacitor element 30 via the second terminal contact device 442, the second metal shaped body 44 to the second contact point 440. According to the invention, the current path of each individual capacitor element 30 formed from the first and second partial current paths 52, 54 is the same for all capacitor elements 30, as far as this is technically possible. In other words, minimal differences in length due to technical reasons, in the range of a few percent of the total length, should not be taken into account here. This applies not only to this exemplary embodiment, but to all technical implementations of the power electronic assembly according to the invention.

Figure 2:
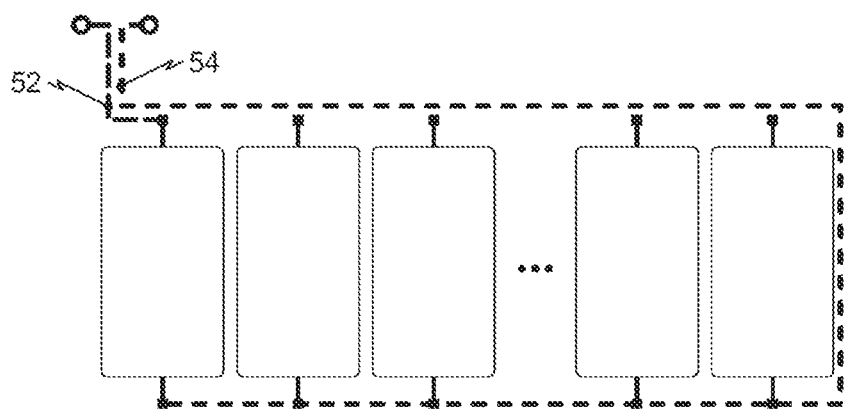
FIG. 2 shows two current paths through the first assembly.
Figure 2:
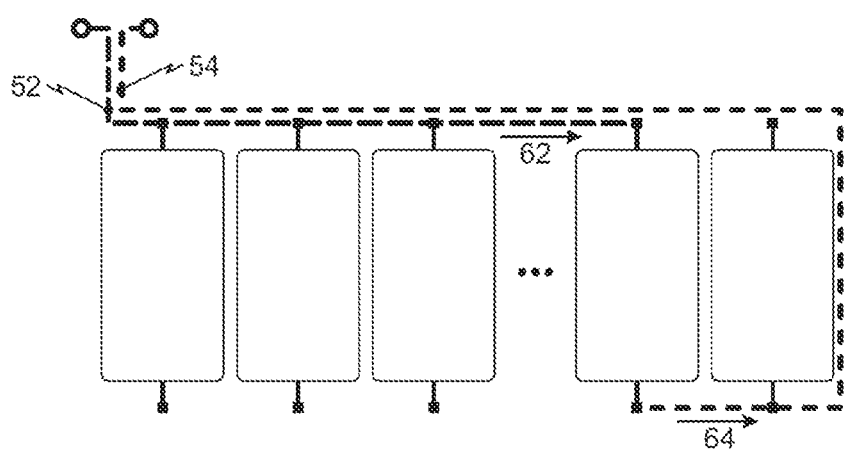

FIG. 2 shows an example of two of the possible current paths through the first assembly. Both the first of the N capacitor elements in the x-direction and the penultimate of the N capacitor elements in the x-direction, and thus also all other current paths, have the same length here. For this purpose, it is sufficient, but not necessary, if a first current flow direction 62 in the portion of the terminal contact devices 422 of the first metal shaped body 42 is the same as a second current flow direction 64 in the portion of the terminal contact devices 442 of the second metal shaped body 44.

Figure 3:
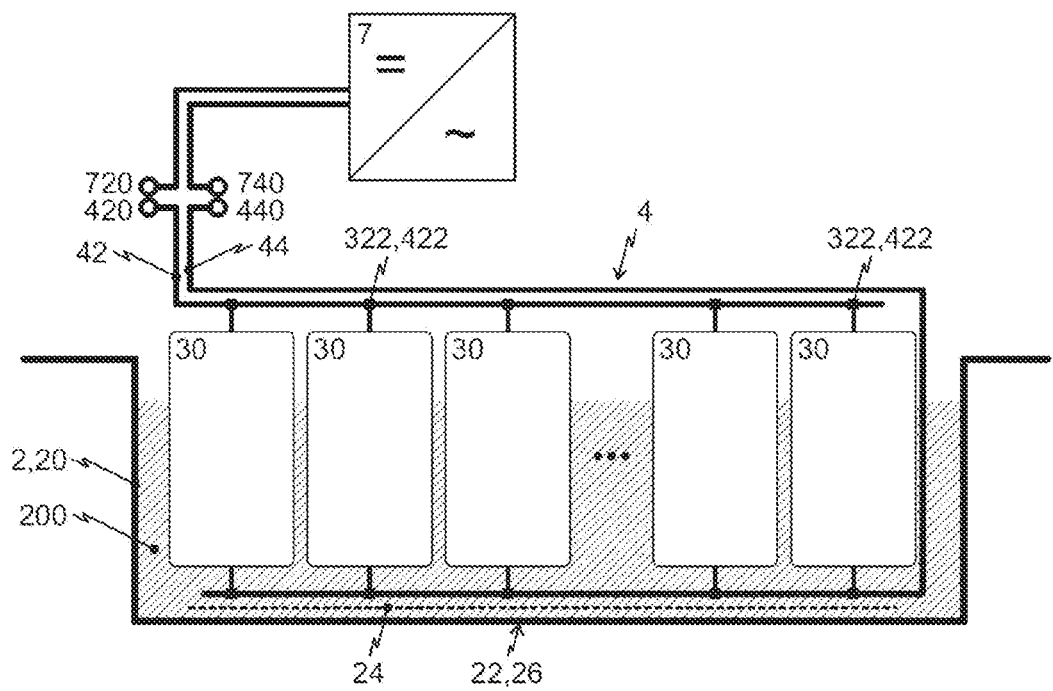
FIG. 3 shows the first assembly with further components.

FIG. 3 shows the first assembly with further components, namely the power semiconductor module 7 already mentioned above and with a housing 2. The power semiconductor module 7 is formed here as an inverter module, as is used by way of example in electric drives of vehicles, in particular of passenger cars. Advantageously, the output of this converter module has several phases, in particular three phases. On the DC voltage side, contact points 420, 440 of the capacitor busbar 4 are electrically conductively connected to the associated module contact points 720, 740 of the power semiconductor module 7 polarity-appropriately.

The housing 2 has a cup-like recess 20 in which the capacitor device 3 is arranged completely or, as shown here, over 80% of its volume. For reasons of better heat dissipation and also stability, the recess 20 around the capacitor device 3 and here also reaching into the capacitor device 3 is almost completely filled with a potting compound 200. Preferably, this potting compound 200 is also electrically insulating.

In order to improve the indirect transfer of heat from the capacitor device 3 to a cooling device, the second metal shaped body 44 is in indirect thermal contact in the portion of its terminal contact devices 442 with a cooling surface 22, which in this case is part of the housing 2, more precisely is part of the bottom 26 of the recess 20. The cooling surface 22 itself is in direct thermal contact with a cooling liquid, not shown, which flows through the housing 2. Between the cooling surface 22 and the second metal shaped body 44, an electrically insulating but thermally conductive insulation device 24, here in the form of a plastics film, is arranged in the portion of the connection devices 442.

Figure 4:
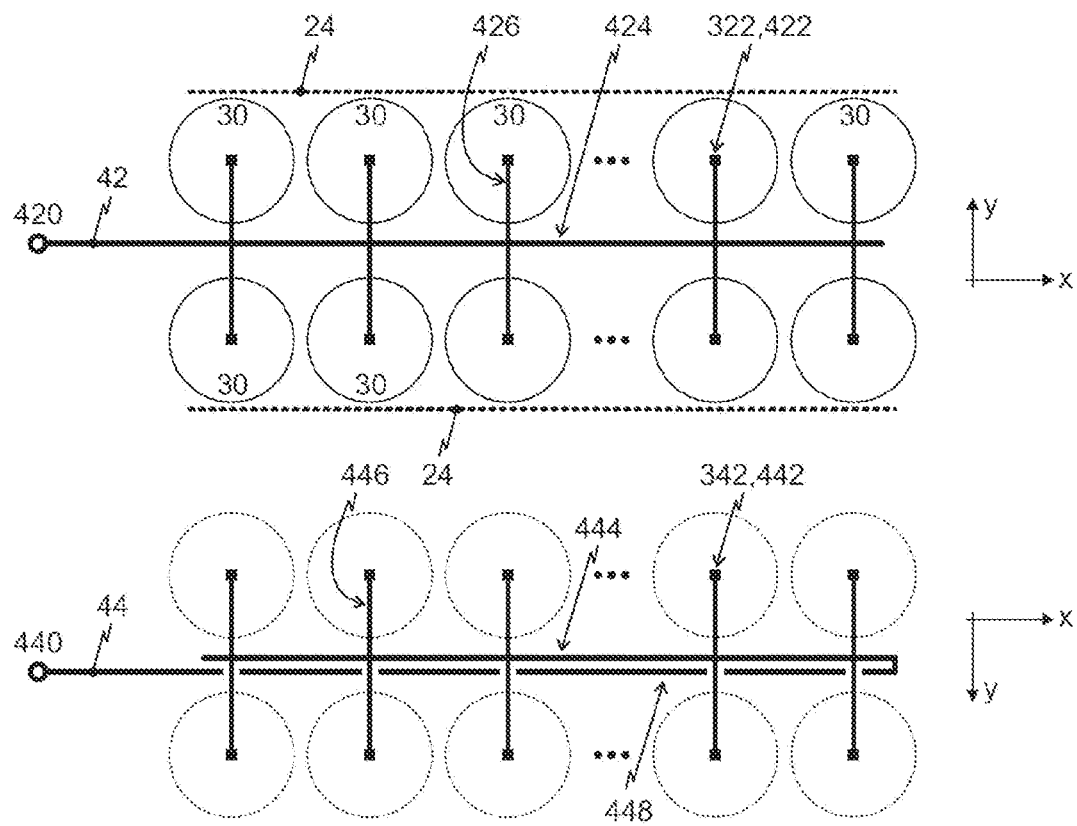
FIG. 4 shows plan views of a second assembly according to the invention.

FIG. 4 shows top and bottom views, i.e., against and in the z-direction, respectively, of a second assembly according to the invention. The capacitor device 3 is similar to the one described in FIG. 1, with the exception that the capacitor elements 30 are arranged in a 2×N matrix. In addition, the capacitor device 3 is connected here laterally and directly to a cooling surface 22, which is not shown, via an electrically insulating, thermally conductive insulation device 24, which is only shown in the upper part of the figure.

The capacitor busbar 4 again has a first metal shaped body 42 with a first contact point 420, shown schematically in the upper part of FIG. 4, and a second metal shaped body 44 with a second contact point 440, immediately adjacent to the first, shown schematically in the lower part of FIG. 4.

In the region of the capacitor device 3, the first metal shaped body 42 forms a linear main portion running centrally between the two rows of capacitor elements 30, with a plurality of sub-portions 426 projecting laterally, more precisely on both sides, here at an angle of 90°. In this case, the first terminal contact devices 322 associated with each capacitor element 30 are arranged on the respective laterally projecting sub-portions 426. The first terminal contact devices 322 are electrically conductively connected to the first capacitor contact devices 422.

In the region of the capacitor device 3, the second metal shaped body 44 also forms a linear main portion 444 extending centrally between the two rows, with the same number of sub-portions 446 projecting on both sides at a 90° angle. Here, the second terminal contact devices 442 associated with each capacitor element 30 are arranged on the respective laterally projecting sub-portions 446. The second terminal contact devices 442 are electrically conductively connected to the second capacitor contact devices 342.

The current direction 62, 64 of the main portions of both metal shaped bodies 42, 44 is identical, here running in the x-direction. The second metal shaped body 44 also has a rear portion 448 which runs parallel to the main portion 444. The current direction in this rear portion 448 is opposite to that in the main portion 444 of the second metal shaped body 44.

Figure 5:
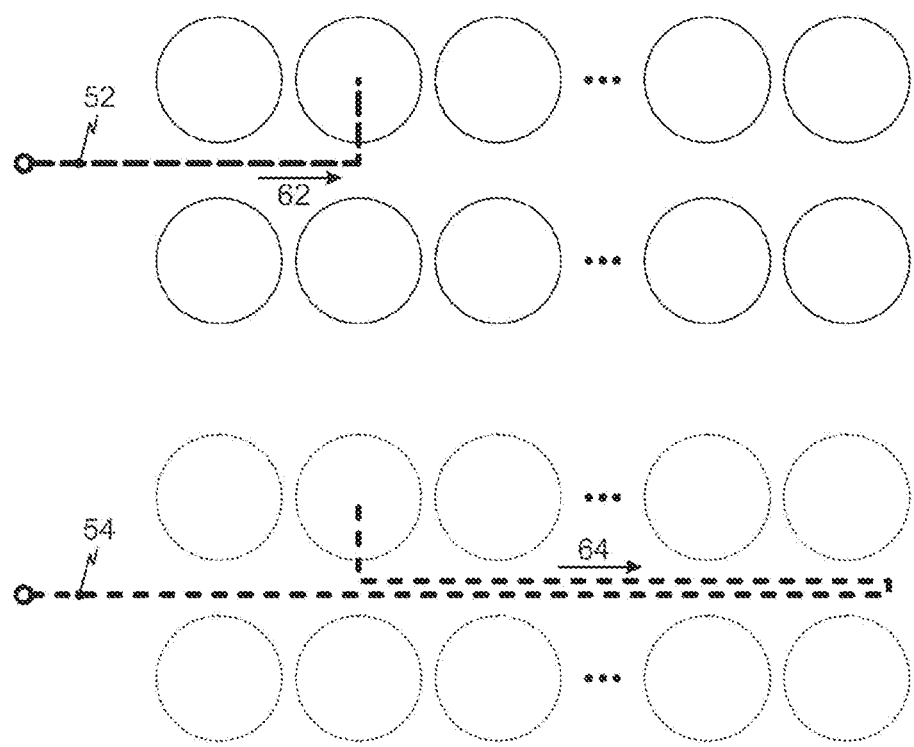
FIG. 5 shows a current path through the second assembly.

FIG. 5 shows an exemplary current path through the second assembly. Due to the design with the rear portion 448, the length of all current paths 62, 64 is again identical within the scope of what is technically feasible.

Figure 6:
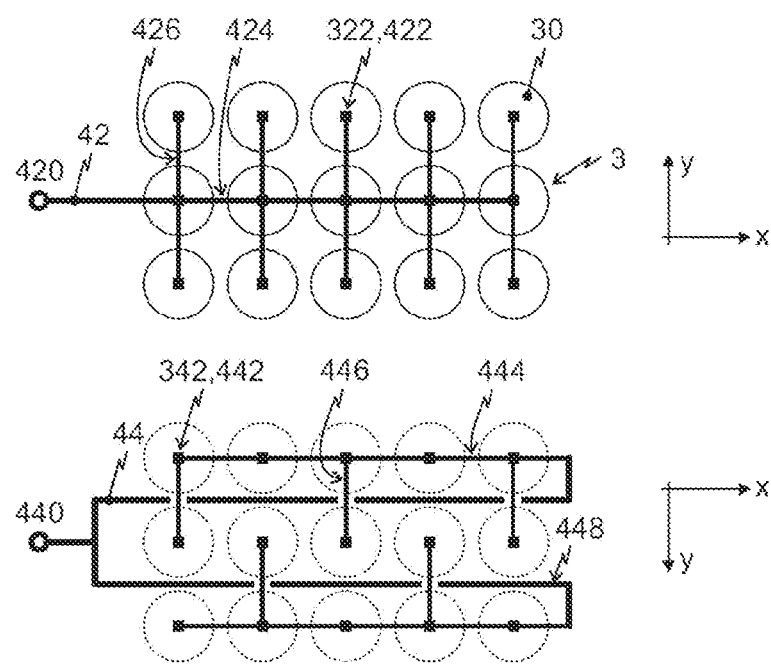
FIG. 6 shows plan views of a third assembly according to the invention.

FIG. 6 shows plan views of a third assembly according to the invention. The capacitor device 3 is similar to that described in FIG. 1, except that the capacitor elements 30 are arranged in a 3×N matrix. The capacitor busbar 4 again has a first metal shaped body 42 with a first contact point 420, shown schematically in the upper part of FIG. 6, and a second metal shaped body 44 with a second contact point 440, directly adjacent to the first, shown schematically in the lower part of FIG. 6.

In the region of the capacitor device 3, the first metal shaped body 42 forms a linear main portion 424 extending centrally between the two rows with a plurality of sub-portions 426 projecting laterally, more precisely on both sides, at a 90° angle here. In this case, the first terminal contact devices 322 associated with each capacitor element 30 are arranged on the respective laterally projecting sub-portions 426, as well as at the junctions between the main portion 424 and the sub-portions 426. The first terminal contact devices 422 are electrically conductively connected to the first capacitor contact devices 322.

In the region of the capacitor device 3, the second metal shaped body 44 forms two main portions 444 extending linearly centrally above the two outer rows of capacitor elements 30. From these main portions 444, sub-portions 446 projecting towards the central row of capacitor elements 30 are arranged in alternation. Here, the second terminal contact devices 442 associated with each capacitor element 30 are arranged on the respective laterally projecting sub-portions 446, as well as at the junctions between the respective main portion 444 and the sub-portions 446. The second terminal contact devices 442 are electrically conductively connected to the second capacitor contact devices 342.

The partial current directions 62, 64 of all main portions 424, 444 of both metal shaped bodies 42, 44 are identical, here running in the x-direction. The second metal shaped body 44 also has two rear portions 428, which run parallel to the main portions 444. The current direction 62, 64 in these rear portions 448 is opposite to that in the main portions 444 of the second metal shaped body.

Also, the inventors intend that only those claims which use the specific and exact phrase "means for" are intended to be interpreted under 35 USC 112. The structure herein is noted and well supported in the entire disclosure. Moreover, no limitations from the specification are intended to be read into any claims, unless those limitations are expressly included in the claims.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure covers modifications and variations of this disclosure provided they come within the scope of the appended claims and their equivalents.

What is claimed is:

1. A power electronic assembly, comprising:
   a housing and a capacitor device arranged therein;
   the capacitor device has a plurality of capacitor elements, each having a first and a second capacitor contact device, and a capacitor busbar which has a first metal shaped body with a first contact point and a second metal shaped body with a second contact point;

the first metal shaped body of a first polarity has a plurality of first terminal contact devices each electrically conductively connected to a first capacitor contact device;

the second metal shaped body of a second polarity has a plurality of second terminal contact devices each electrically conductively connected to a second capacitor contact device; and wherein respective individual current paths, each formed from a first partial current path extending between the first contact point and a first terminal contact device and a second partial current path between the second terminal contact device associated with the first and the second contact point each have the same current path length;

wherein the capacitor elements are arranged in an M×N matrix, with M>0 and N>2;

wherein one of the first and the second metal shaped bodies is formed, in the region of the capacitor device, with a linear main portion with a plurality of laterally projecting sub-portions;

wherein the associated terminal contact devices are arranged in the course of the respective laterally projecting sub-portions, and at least one of the first and the second metal shaped bodies is formed with a plurality of linear main portions, with laterally projecting sub-portions; and wherein the associated first terminal contact devices are arranged both on the respective main portion and on the respective sub-portions.

2. The assembly, according to claim 1, wherein:
the respective first capacitor contact device of the capacitor element is arranged on a first surface and the associated second capacitor contact device is arranged on a second surface of the capacitor element opposite the first surface.

3. The assembly, according to claim 1, wherein:
a rear portion is arranged parallel to the main portion.

4. The assembly, according to claim 1, wherein:
a first current flow direction in the portion of the terminal contact devices of the first metal shaped body is equal to a second current flow direction in the portion of the terminal contact devices of the second metal shaped body.

5. The assembly, according to claim 1, wherein:
a power semiconductor module is arranged in the housing and is electrically conductively connected to the contact points of the capacitor busbar polarity-appropriately.

6. The assembly, according to claim 1, wherein:
the housing has a cup-like recess in which the capacitor device is arranged.

7. The assembly, according to claim 6, wherein:
at least one of the first and the second metal shaped bodies, in the portion of its terminal contact devices, is in indirect thermal contact with a cooling surface; and
wherein a bottom of the recess is designed as the cooling surface.

8. The assembly, according to claim 6, wherein:
the recess around the capacitor device is at least partially filled with an electrically insulating potting compound.

9. The assembly, according to claim 1, wherein:
at least one of the first and the second metal shaped bodies, in the portion of its terminal contact devices, is in indirect thermal contact with a cooling surface.

10. The assembly, according to claim 9, wherein:
an electrically insulating insulation device, in the form of one of a plastics film layer and an insulating ceramic layer, is arranged in the portion of the connection devices between the cooling surface and the at least one of the first and the second metal shaped bodies.

11. The assembly, according to claim 9, wherein:
the cooling surface is formed as a part of the housing through which a cooling liquid flows.

* * * * *